(12) United States Patent
Shih et al.

(10) Patent No.: US 7,542,742 B2
(45) Date of Patent: Jun. 2, 2009

(54) DOWN CONVERTER WITH SHIELDING STRUCTURE

(75) Inventors: Huang-Chen Shih, Taipei Hsien (TW);
Cheng-Nan Lee, Taipei Hsien (TW);
Tsung-Ying Chung, Taipei Hsien (TW);
Yung-Chin Chen, Taipei Hsien (TW);
Hung-Yuan Lin, Taipei Hsien (TW)

(73) Assignee: Wistron NeWeb Corporation, Hsi-Chih, Taipei Hsien (TW)

( * ) Notice: Subject to any disclaimer, the term of this patent is extended or adjusted under 35 U.S.C. 154(b) by 712 days.

(21) Appl. No.: 11/160,256

(22) Filed: Jun. 16, 2005

(65) Prior Publication Data
US 2006/0183445 A1    Aug. 17, 2006

(30) Foreign Application Priority Data
Feb. 14, 2005    (TW) .............................. 94104378 A

(51) Int. Cl.
*H04B 1/10*    (2006.01)
*H04B 1/26*    (2006.01)
(52) U.S. Cl. .................. 455/130; 455/300; 455/323
(58) Field of Classification Search .......... 455/217, 455/300–301, 344, 13.3, 20–22, 575.5, 313–328; 343/763, 784, 851, 869; 333/202–212
See application file for complete search history.

(56) References Cited

U.S. PATENT DOCUMENTS

| 5,313,220 | A | * | 5/1994 | Hemmie et al. ............. 343/840 |
| 5,448,255 | A | * | 9/1995 | Hulett et al. ............... 343/840 |
| 5,874,925 | A | * | 2/1999 | Choi .......................... 343/840 |
| 6,094,113 | A | * | 7/2000 | Wenzel et al. .............. 333/202 |
| 6,168,465 | B1 | * | 1/2001 | Hirota ........................ 439/579 |
| 6,236,292 | B1 | * | 5/2001 | Hershtig .................... 333/212 |
| 6,831,612 | B2 | * | 12/2004 | King et al. .................. 343/772 |
| 6,898,419 | B1 | * | 5/2005 | Fayeski et al. ............. 455/125 |
| 7,177,618 | B2 | * | 2/2007 | Motoyama .................. 455/323 |
| 7,180,391 | B2 | * | 2/2007 | Ala-Kojola ................. 333/207 |
| 7,352,263 | B2 | * | 4/2008 | Pance et al. ................ 333/202 |
| 2003/0193379 | A1 | * | 10/2003 | Lye et al. .................... 333/203 |

FOREIGN PATENT DOCUMENTS

CN    2505054 Y    8/2002

* cited by examiner

*Primary Examiner*—Simon D Nguyen
(74) *Attorney, Agent, or Firm*—Winston Hsu

(57) ABSTRACT

A down converter includes a housing, a down conversion circuit, and a shielding structure. The down conversion circuit is disposed in the housing. The shielding structure is disposed above the down conversion circuit. The shielding structure comprises a cavity and a fine-tunable mechanism. A size of the cavity is adjusted by the fine-tunable mechanism.

20 Claims, 11 Drawing Sheets

US 7,542,742 B2

DOWN CONVERTER WITH SHIELDING STRUCTURE

BACKGROUND OF THE INVENTION

1. Field of the Invention

The claimed invention relates to a down converter, and more particularly discloses a down converter having the function of adjusting filtering effect.

2. Description of the Prior Art

Please refer to FIG. 1, which is a diagram of the prior art down converter. The prior art down converter 1 comprises a housing 30, a down conversion circuit 200, and a shielding structure 10. The down conversion circuit 200 is disposed in the housing 30. The shielding structure 10 is disposed above the down conversion circuit 200.

Please refer to FIG. 2, which is a diagram of the prior art down conversion circuit 200. The down conversion circuit 200 comprises a radio frequency circuit 250 and an intermediate frequency circuit 260. The radio frequency circuit 250 is coupled with the intermediate frequency circuit 260. The radio frequency circuit 250 is able to receive multiple radio signals (for example, left-hand circular polarization signals and right-hand circular polarization signals in the same frequency band), down-convert the radio signals, and transmit them to the intermediate frequency circuit 260. The radio frequency circuit 250 comprises four antennas 211, 221, 231, and 241, a low noise amplifier 212, a radio frequency bandpass filter 214, two mixers 216 and 217, a local oscillator 218, eight intermediate frequency filters 219, 210, 222, 223, 232, 233, 242, and 243, and an intermediate frequency amplifier 213. The radio signals are received and down-converted by the elements of the radio frequency circuit 250. Moreover, the function of the radio frequency bandpass filter 214 is filtering noise of particular frequency bands (for example, from 17.3 GHz to 17.8 GHz) in the radio signals so that the mixing effect of mixers 216 and 217 can be improved.

Please refer to FIG. 1 again. Since the signals generated by the elements of the down conversion circuit 200 are transmitted by circuit conduction and radiation respectively, the shielding structure 10 is disposed above the down conversion circuit 200 in order to decrease the signal interruptions between the elements of the down conversion circuit 200. For example, please refer to FIG. 3. Multiple cavities are disposed in the shielding structure 10, wherein the multiple cavities correspond to the elements of the down conversion circuit 200 respectively. Therefore the elements of the down conversion circuit 200 can be separated from each other to decrease signal interruptions.

As limited by the precision of printed circuit fabrication process, there are unpredictable dimensional tolerances in the coupling wires of printed circuits of radio frequency bandpass filters used in down conversion circuits. Therefore the filtering effect of the filter is difficult to handle accurately. At the same time, a cavity resonance effect is also generated between the radio frequency bandpass filter and the cavities of the shielding structure. The cavity resonance effect can be as described in *IEEE, Transactions on Microwave Theory and Techniques*, Vol. 48, No. 8, August 2000. If there are unpredictable dimensional tolerances in the process precision of the shielding structure, the cavity resonance effect can also influence the filtering effect of the radio frequency bandpass filter.

SUMMARY OF THE INVENTION

The claimed invention discloses a down converter (also called a LNBF, Low-Noise Block Down-Converter with Feed) to solve the aforementioned problems. The down converter comprises a housing, a down conversion circuit, and a shielding structure. The down conversion circuit is disposed in the housing and comprises at least one radio frequency bandpass filter. The shielding structure is disposed above the down conversion circuit and comprises at least one cavity and at least one adjusting mechanism. Moreover, a filtering effect is capable of being adjusted by adjusting a size of the cavity with the fine-tuning mechanism, which is disposed above the cavity.

The claimed invention is capable of adjusting dimensional tolerances of a printed circuit and the shielding structure so that a specific filtering effect of a radio frequency bandpass filter can be attained.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a fine-tuning mechanism disposed above a shielding structure for adjusting a filtering effect of a radio frequency bandpass filter by applying a cavity resonance effect. The method is to dispose the fine-tuning mechanism above the shielding structure for adjusting sizes of the cavities of the radio frequency bandpass filter. The following embodiments of the present invention are merely explained in conjunction with a radio bandpass filter, and those skilled in the art will recognize that the essence of the present invention can be applied to other kind of filters to enhance their filtering effects.

The First Embodiment

Figure 4:
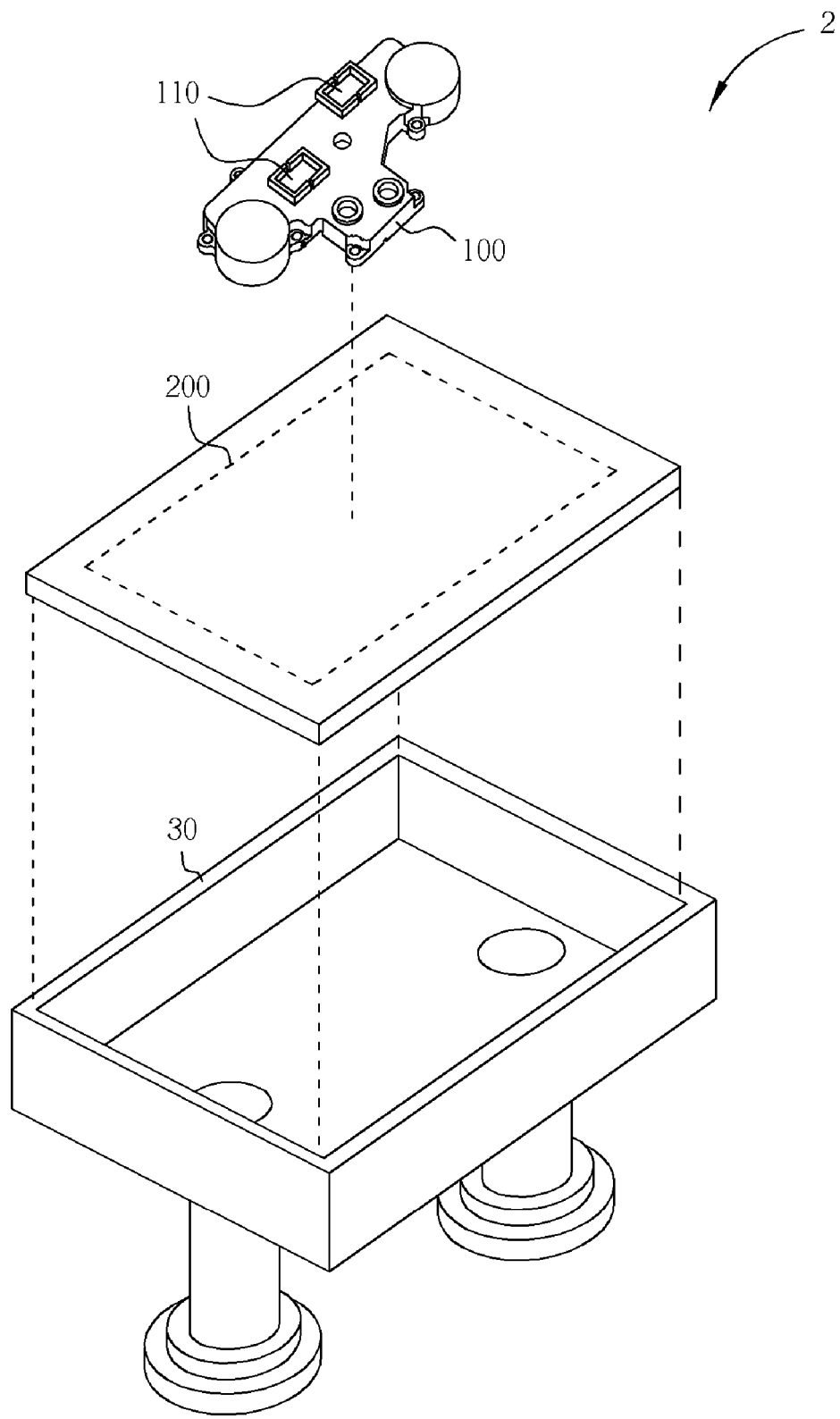
FIG. 4 shows a down converter of the first embodiment of the present invention.
Figure 5:
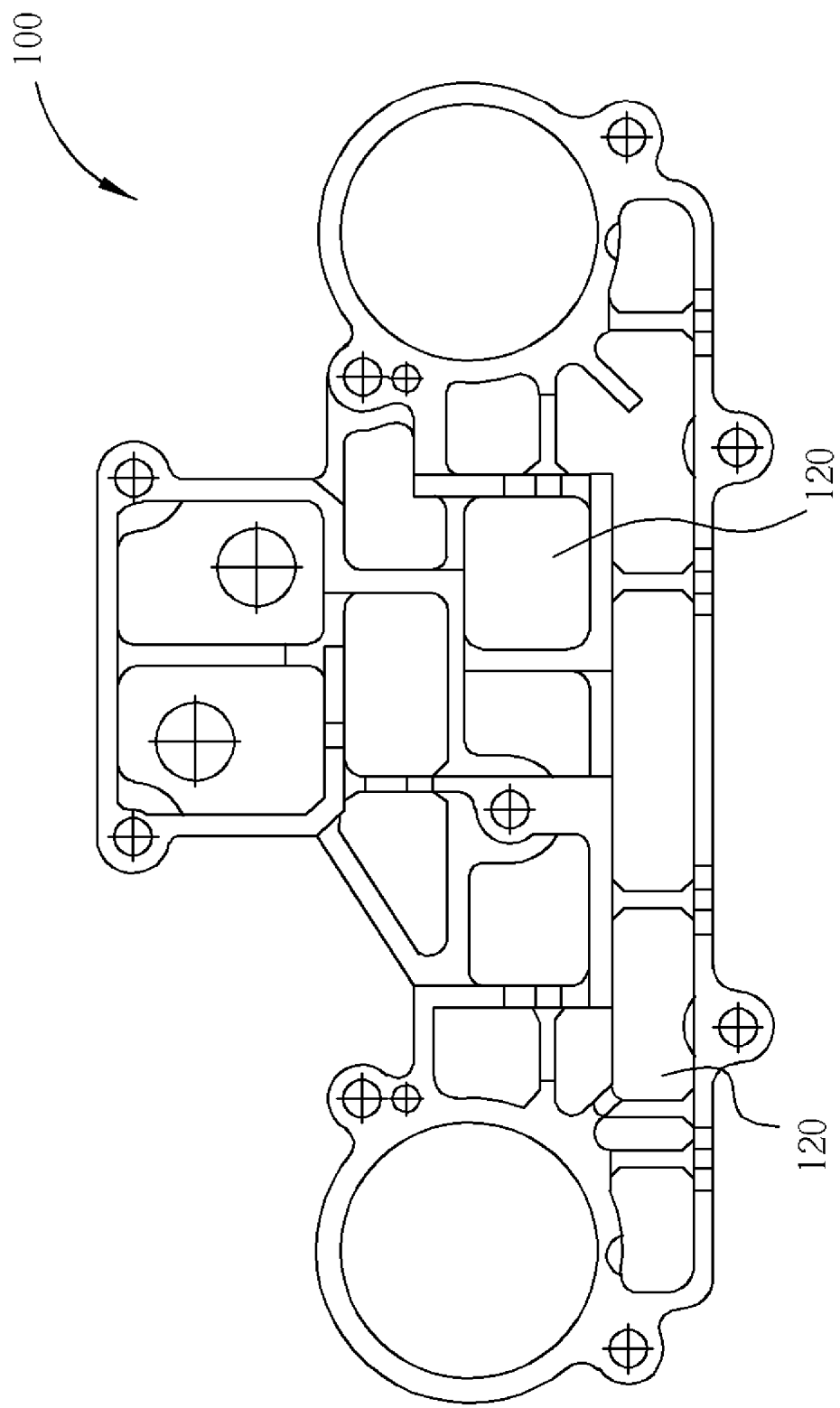
FIG. 5 shows a shielding structure of the down converter of the first embodiment of the present invention.

Please refer to FIG. 4, which discloses a down converter 2 in the first embodiment of the present invention. The down converter 2 comprises a housing 30, a down conversion circuit 200, and a shielding structure 100. The down conversion circuit 200 is disposed in the housing 30. The shielding structure 100 is disposed above the down conversion circuit 200, and the fine-tuning mechanism 110 is disposed above the shielding structure 100. Please refer to FIG. 5 showing at least one cavity 120 is disposed in the shielding structure 100. The fine-tuning mechanism 110 can be disposed in the cavity 120, which is going to be adjusted later, above the radio frequency bandpass filter 214 of FIG. 2 depending on requirements such as, for example, when the filtering rejection ratio of a radio frequency bandpass filter at 17.8 GHz is required to be −25 dBc or less. By adjusting the fine-tuning mechanism 110, adjusting the size of the cavity 120 results in adjusting the filtering effect of the radio bandpass filter 214 of FIG. 2.

Figure 1:
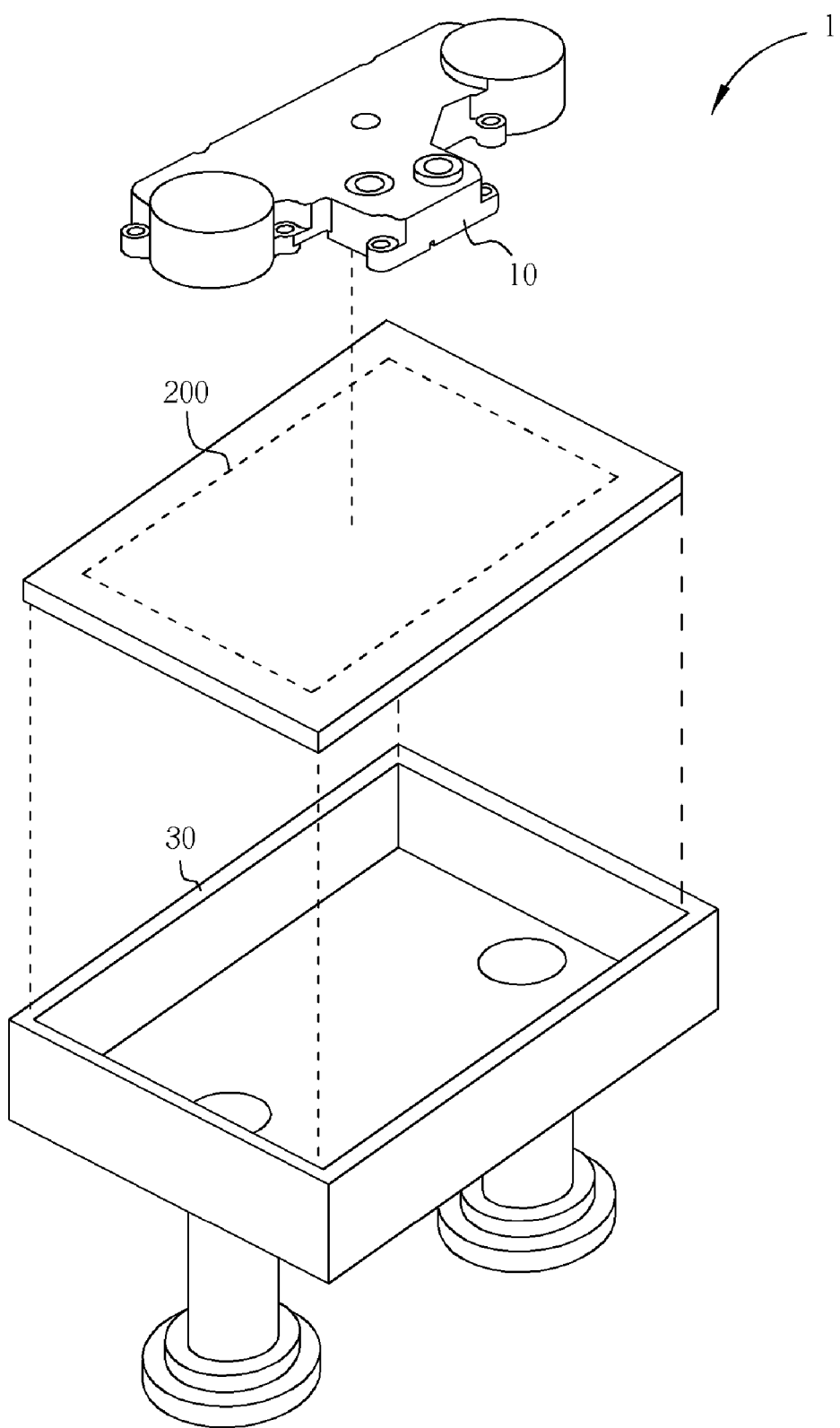
FIG. 1 is a diagram of a prior art down converter.
Figure 2:
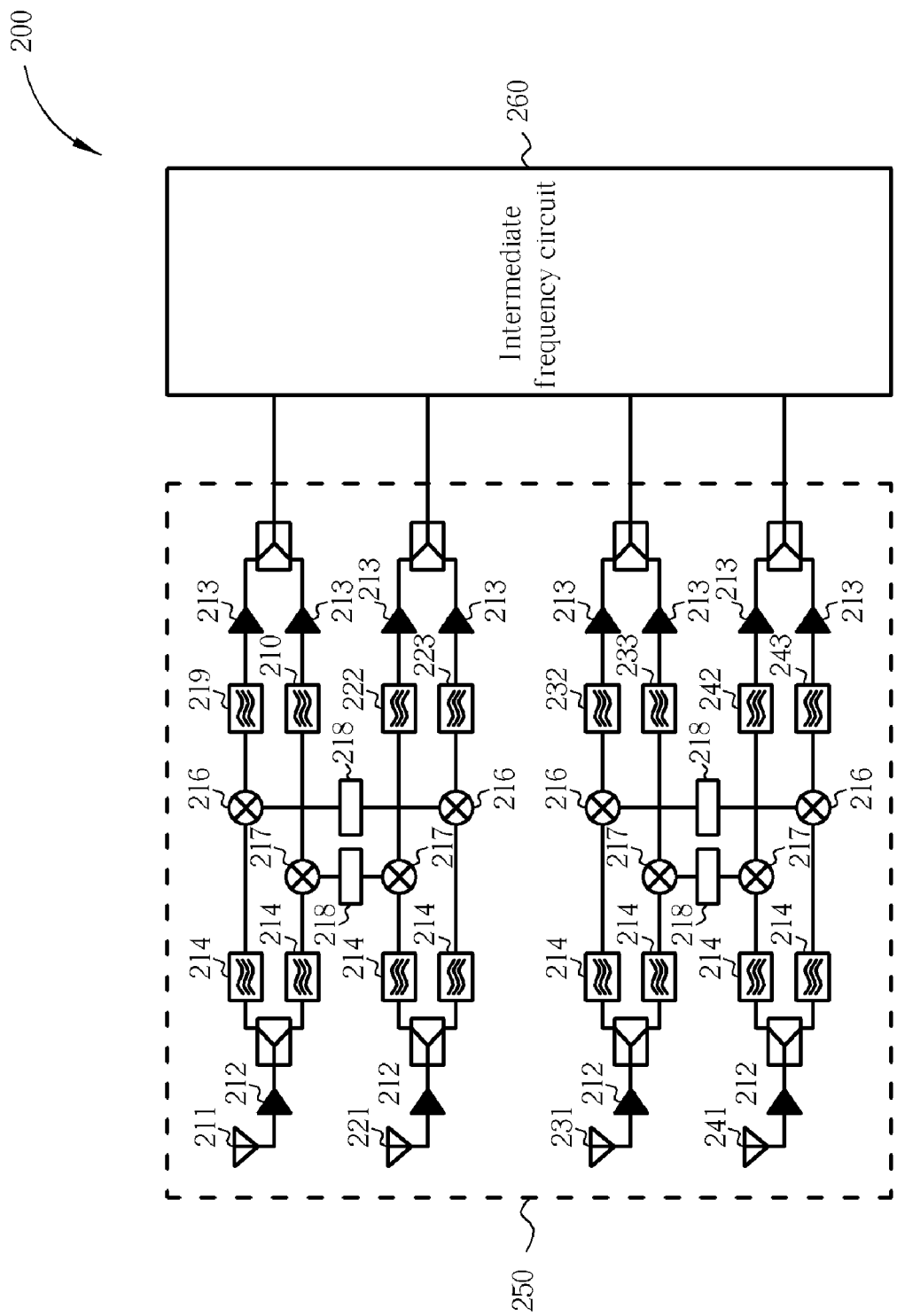
FIG. 2 is a diagram of a prior art down conversion circuit.
Figure 3:
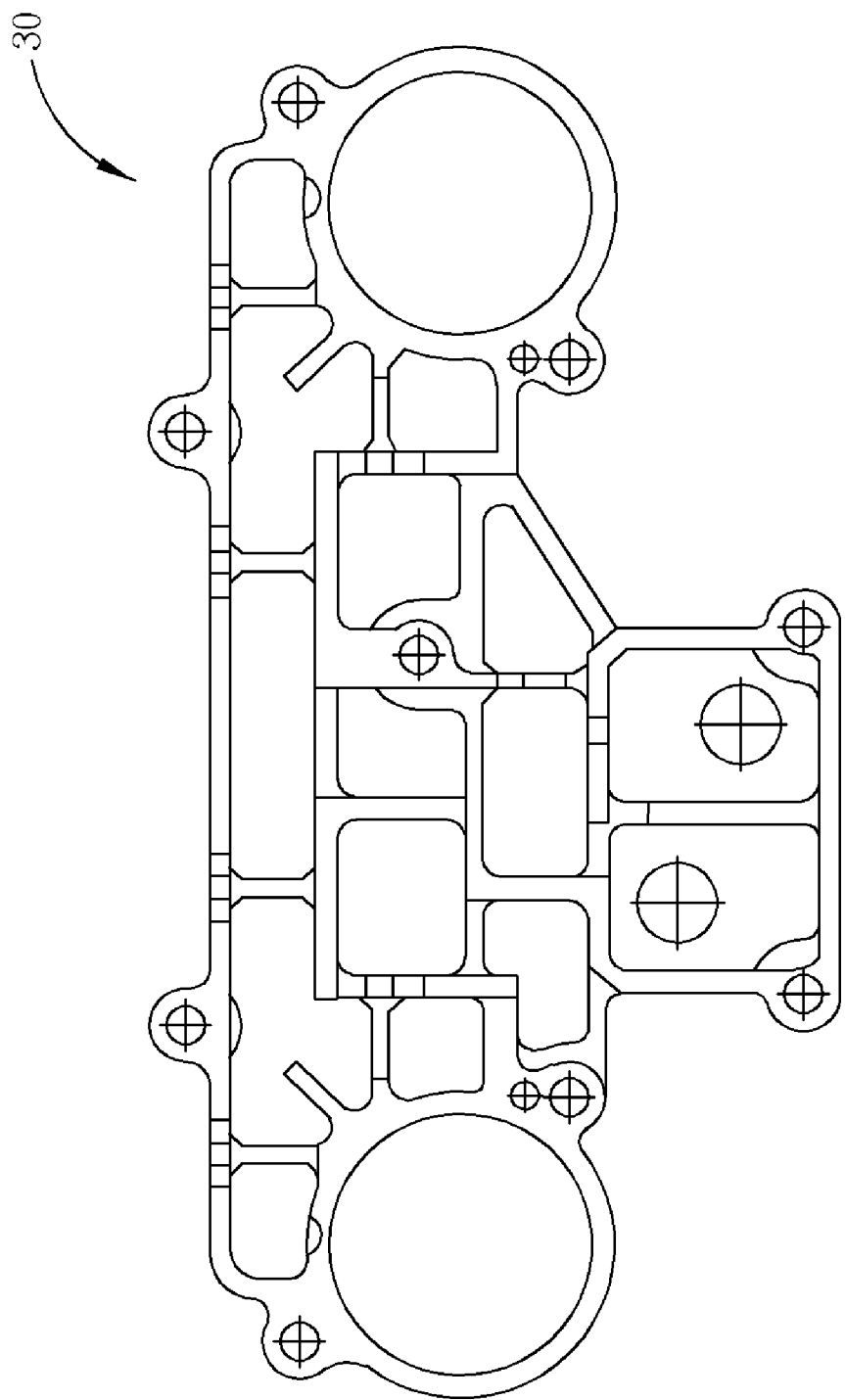
FIG. 3 is a diagram of detailed structure of the prior art shielding structure.

The consideration about the disposition of the adjusting mechanism 110 mainly depends on the down conversion circuit 200, the process precision of the shielding structure 100, the rejection ratio requirement of the radio bandpass filter 214 of FIG. 2, and the cost. The purpose is to compensate for lack of precision by adjusting the fine-tuning mechanism 110, under tolerable errors, for the radio frequency bandpass filter 214 of FIG. 2 to achieve a specific filtering effect. Therefore the requirements in specifications, for example, filtering effects, can be achieved with less cost.

Figure 6:
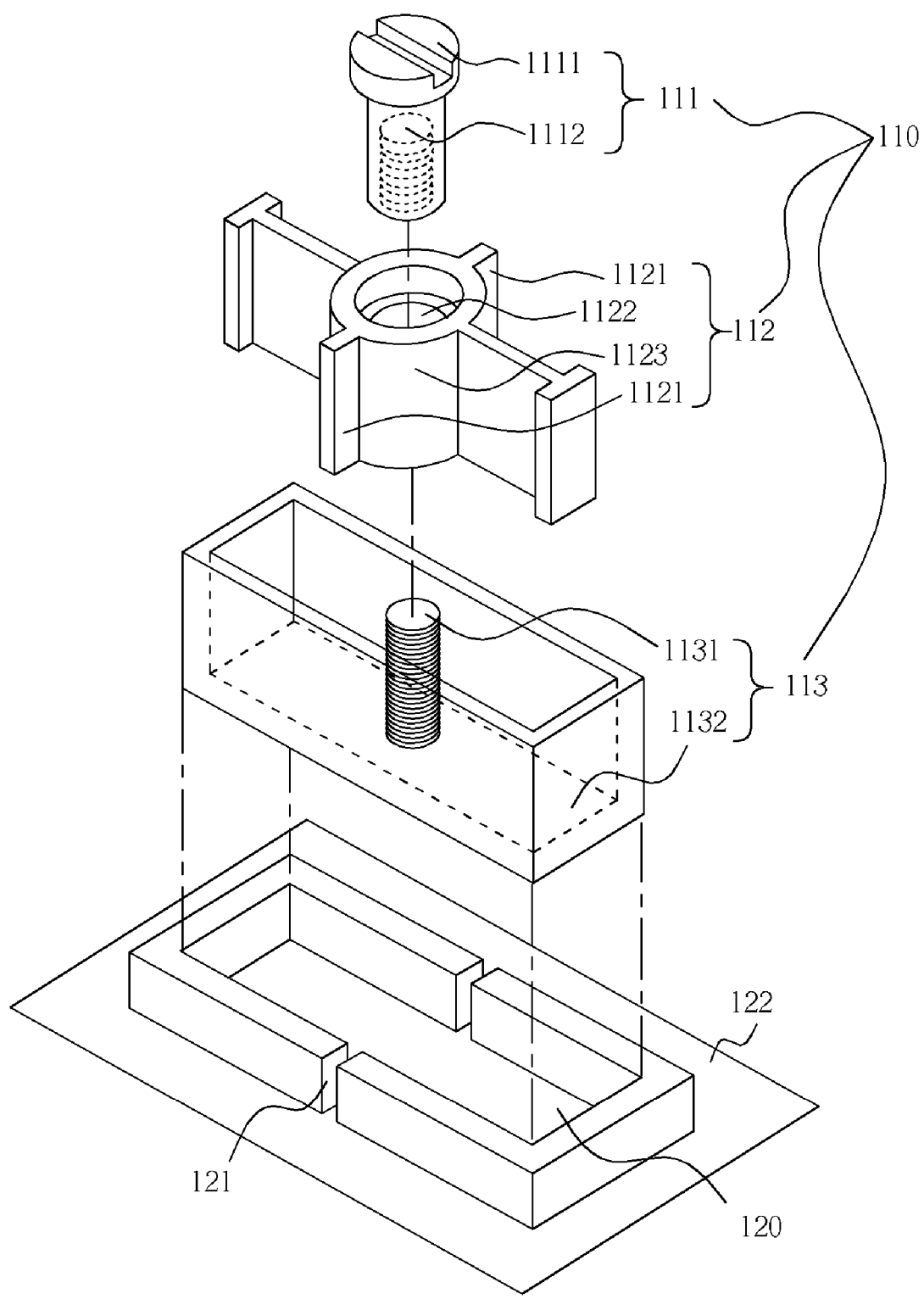
FIG. 6 is an exploded view of the fine-tuning mechanism in the first embodiment of the present invention.

Please refer to FIG. 6, which is an exploded view of the fine-tuning mechanism 110 of the first embodiment of the present invention comprising a rotational modulation element 111, a fixed element 112, and a masking element 113. The rotational modulation element 111 comprises an engaging part 1111 and an internally threaded part 1112. The fixed element 112 comprises flanges 1121, an opening 1122, and a body 1123. The body 1123 of the fixed element 112 is penetrated by the opening 1122. The flanges 1121 extend from the body 1123. The masking element 113 comprises a shift modulation part 1131 and a plate 1132, wherein the shift modulation part 1131 is disposed above the plate 1132. The fine-tuning mechanism 110 is disposed inside the cavity 120. Grooves 121 are disposed in positions next to the cavity 120, wherein the positions are above the casing 122 of the shielding structure 100.

Figure 7:
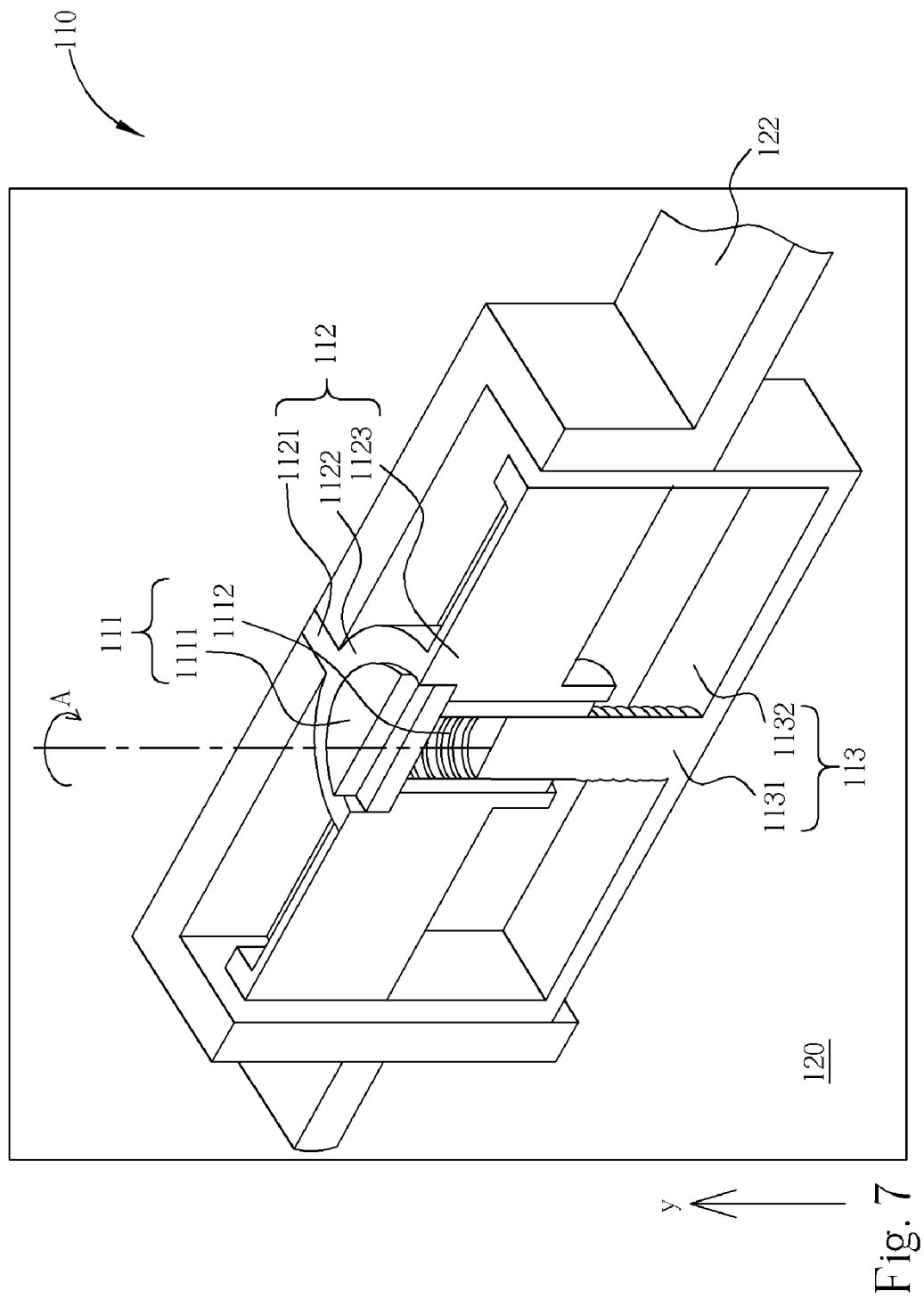
FIG. 7 is a cutaway view of the fine-tuning mechanism and its neighboring structure after combination in the first embodiment of the present invention, wherein the fine-tuning mechanism is in a first position.

Please refer to FIG. 7, which is a cutaway view of the fine-tuning mechanism 110 and its neighboring structure after combination in the first embodiment of the present invention, wherein the fine-tuning mechanism 110 is in a first position. The flanges 1121 of the fixed element 112 are mated with the grooves 121. The engaging part 1111 of the rotational modulation element 111 engages with the surrounding edge of the opening 1122, furthermore, the shift modulation element 111 is disposed through the opening 1122. The shift modulation part 1131 is threaded into the internally threaded part 1112 of the rotational modulation element 111.

Figure 8:
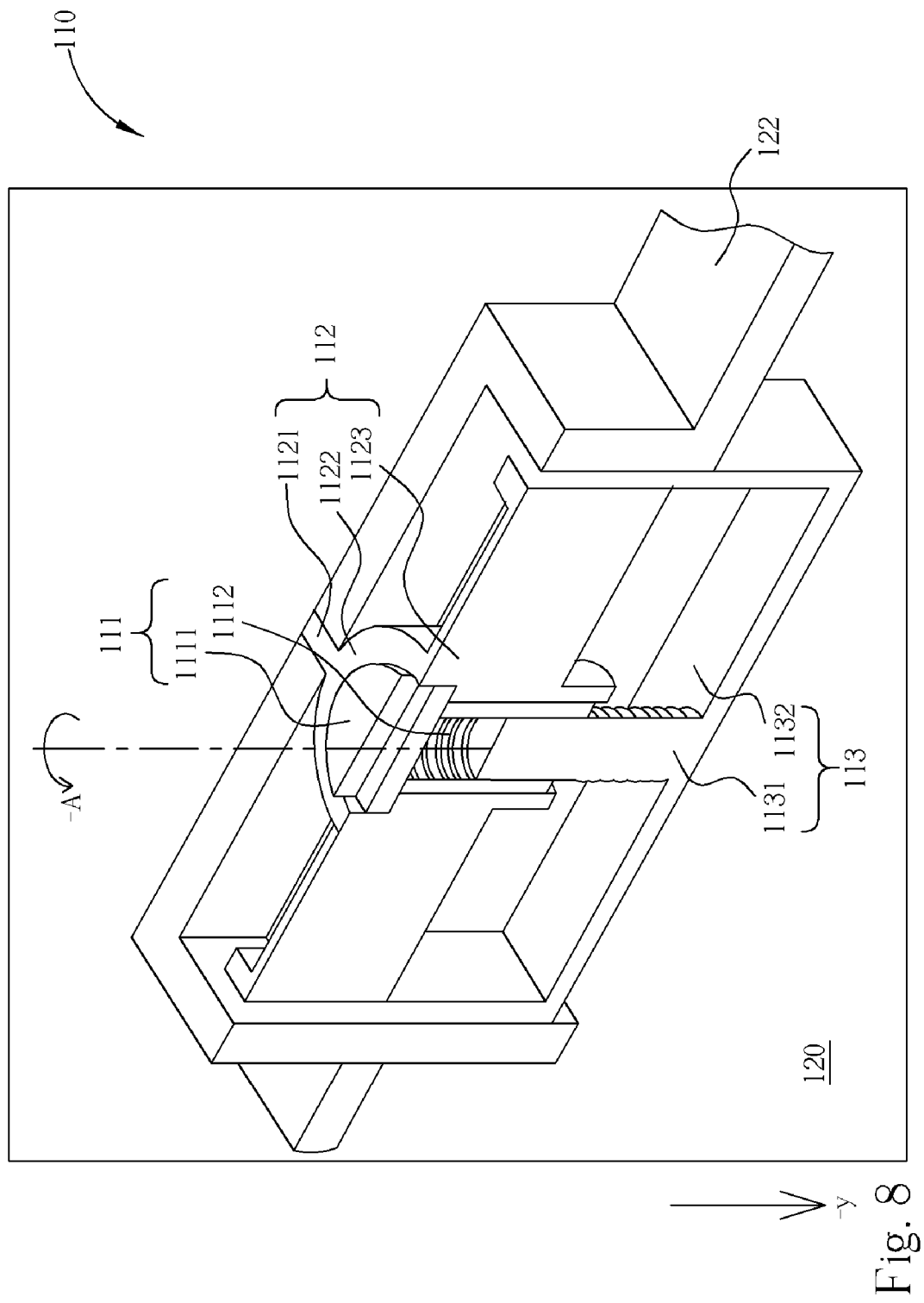
FIG. 8 is a cutaway view of the fine-tuning mechanism and its neighboring structure after combination in the first embodiment of the present invention, wherein the fine-tuning mechanism is in a second position.

By rotating the rotational modulation element 111, the shift modulation element 1131 is shifted which results in the movement of the masking element 113, wherein the movement of the masking element 113 adjusts the size of the cavity 120. In this embodiment, adjusting the size of the cavity 120 is equal to adjusting the height of the cavity 120. For example, when the rotational modulation element 111 is rotated in a first rotational direction A, the masking element 113 is shifted in a first shift direction y (upward) from the first position shown in FIG. 7 to a second position shown in FIG. 8. Similarly, according to FIG. 8, when the rotational modulation element 111 is rotated in a second rotational direction −A, the masking element 113 is shifted in a second shift direction −y (downward) from the second position shown in FIG. 8 to the first position shown in FIG. 7.

The size of the cavity 120 is adjusted by the rotational modulation element 111 so that a specific filtering effect will be reached by collocating signals outputted from the radio frequency bandpass filter 214 of FIG. 2. Furthermore, constraining materials like viscose or welding fluid can be applied to the fine-tuning mechanism 110 to constrain its movement and fix the size of the cavity 120.

Figure 9:
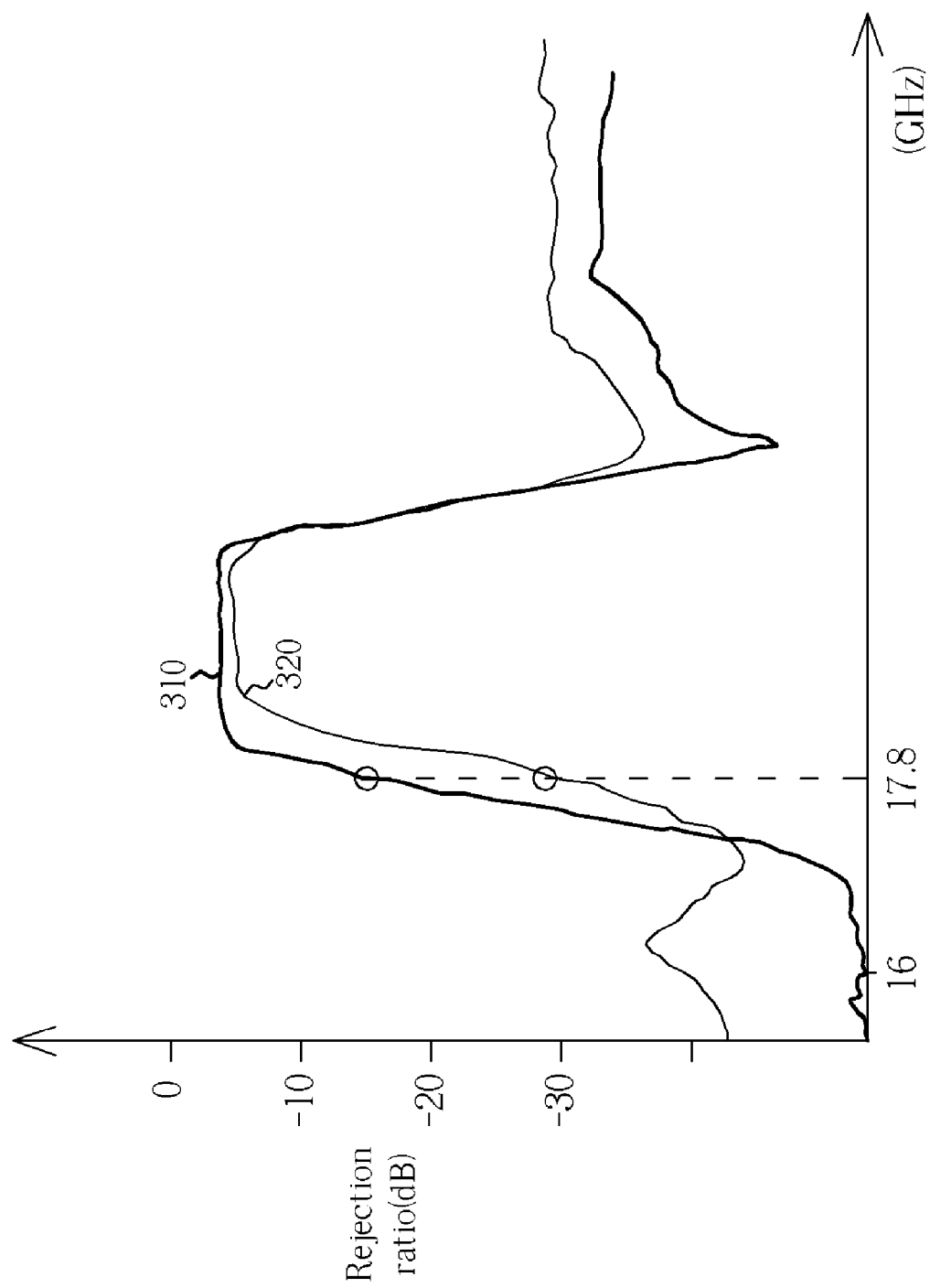
FIG. 9 is a line graph of filtering effect of the first embodiment of the present invention.

The first embodiment allows adjustment of the dimensional tolerance of the printed circuit and the shielding structure so that a specific filtering effect can be reached. Please refer to FIG. 9, which is a line graph of a filtering effect of the first embodiment of the present invention. For example, the rejection ratio of a frequency response 310 of the radio frequency bandpass filter of a prior art down converter is between −10 db and −20 db, while the rejection ratio of a frequency response 320 of the radio frequency bandpass filter of the down converter of the first embodiment is about −30 db. Furthermore, the bandwidth of the frequency response 320 is narrower than the bandwidth of the frequency response 310. Therefore, the radio frequency bandpass filter of the first embodiment is better able to achieve a specific filtering effect.

The Second Embodiment

Figure 10:
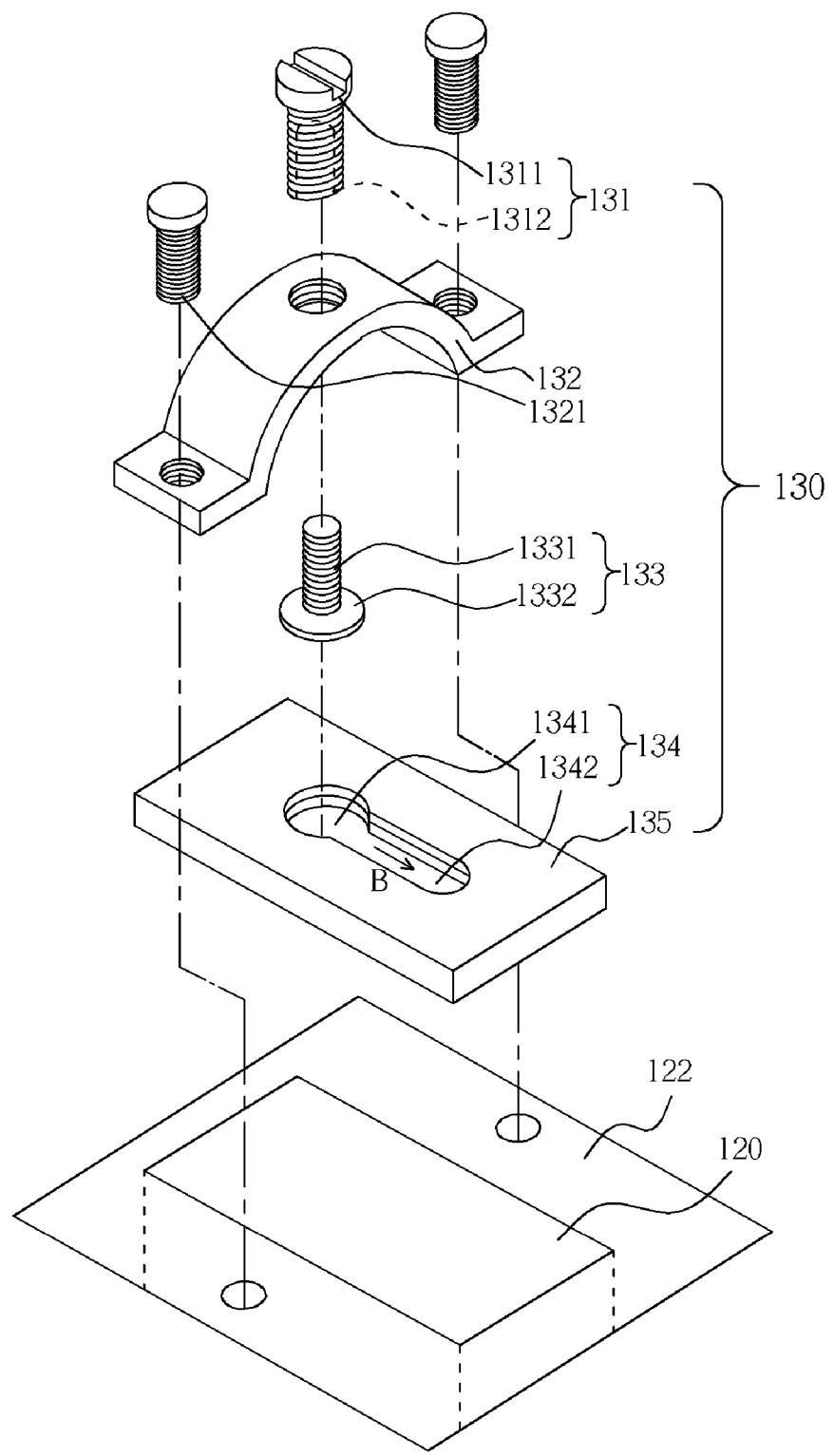
FIG. 10 is an exploded view of the fine-tuning mechanism of a second embodiment of the present invention.

The difference between the second embodiment and the first embodiment of the present invention is the structure of the fine-tuning mechanism. Please refer to FIG. 10, which is an exploded view of a fine-tuning mechanism 130 of the second embodiment of the present invention. The fine-tuning mechanism 130 comprises a rotational modulation element 131, a fixed element 132, a shift modulation element 133, and a masking element 135. The rotational modulation element 131 comprises an externally threaded part 1311 and an internally threaded part 1312. The rotational modulation element 131 is threaded into the fixed element 132 by the externally threaded part 1311. The fixed element 132 is fixed on the casing 122 of the shielding structure by screws 1321. The shift modulation element 133 comprises a threaded part 1331 and a head (engaging part) 1332. The threaded part 1331 is threaded into the internally threaded part 1312. The masking element 135 comprises a groove 134. The groove 134 comprises an wide inserting opening 1341 and a narrowed constraining opening 1342. During fabrication, the head 1332 of the shift modulation element 133 is inserted through the groove 134 at the inserting opening 1341 and shifted (or slid) to the constraining opening 1342 in a direction B so that the shift modulation element 133 is engaged with the masking element 135.

Figure 11:
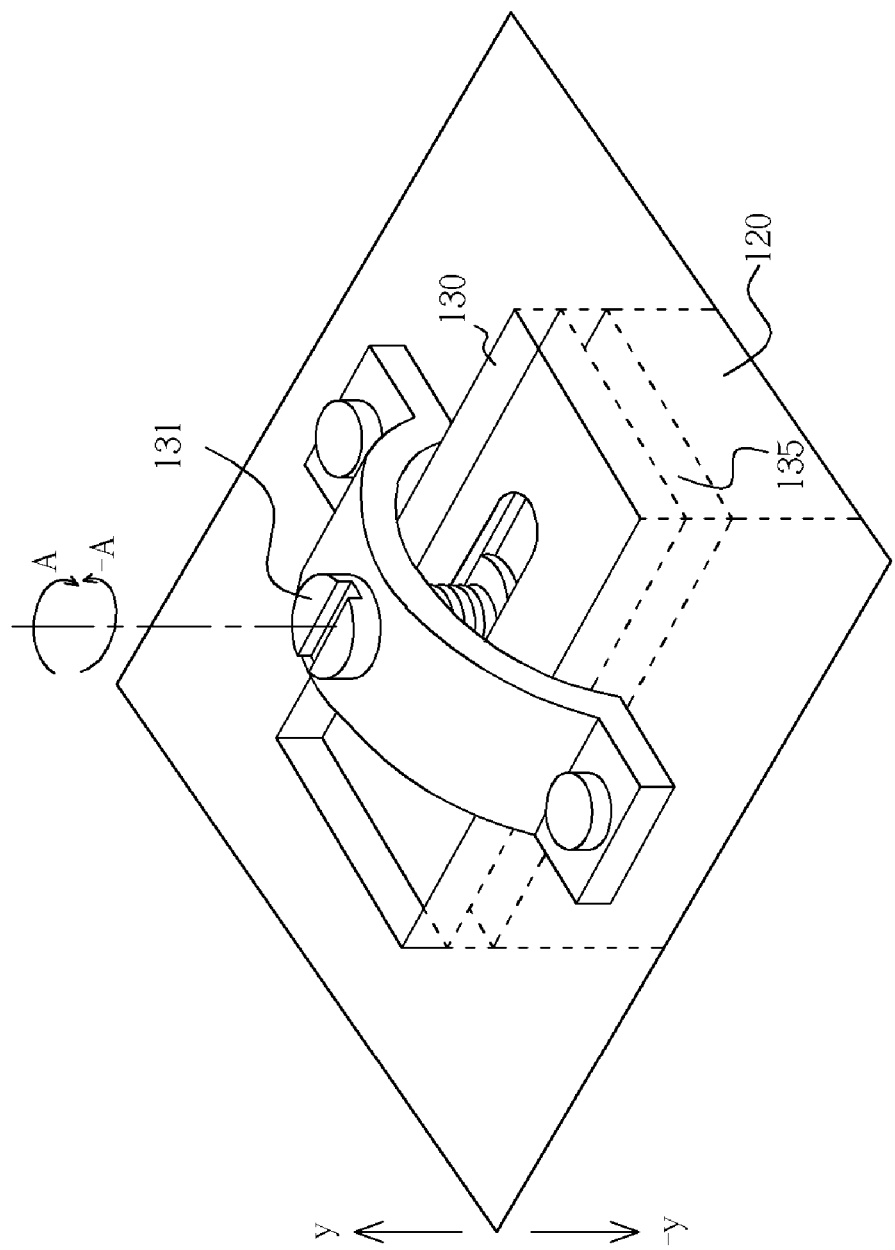
FIG. 11 is a combinational diagram of the fine-tuning mechanism of the second embodiment of the present invention.

Please refer to FIG. 11, which is a combinational diagram of the fine-tuning mechanism 130 of the second embodiment in the present invention. Like the first embodiment, when the rotational modulation element 131 is rotated in a first rotational direction A, the masking element 135 is shifted in a first shifting direction y (upward). When the rotational modulation element 131 is rotated in a second rotational direction −A, the masking element 135 is shifted in a second shifting direction −y (downward). Therefore, the filtering effect of the radio frequency bandpass filter can be adjusted by adjusting the size of the cavity 120.

The purpose of the present invention is adjusting the filtering effect of a radio frequency bandpass filter according to the cavity resonance effect by disposing the fine-tuning mechanism above a shielding structure. However, implementations and scope of application are not constrained by the disclosed embodiments. The present invention can also be applied to improve performance of other down conversion elements such as filters with coupling lines. Furthermore, the function of adjusting the size of the cavities with the adjusting mechanism of the present invention can be reached by other mechanism designs, such as flexible fasteners or sliders.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A down converter comprising:
   a housing;
   a down conversion circuit disposed in the housing and comprising at least one filter; and
   a shielding structure disposed above the down conversion circuit and comprising at least one cavity disposed above the filter and at least one fine-tuning mechanism, the fine-tuning mechanism comprising:
      a fixed element;
      a rotational modulation element rotatably connected to the fixed element;
      a shift modulation element threaded into the rotational modulation element; and
      a masking element connected to the shift modulation element;
   wherein a filtering effect is capable of being adjusted by adjusting a size of the cavity with the fine-tuning mechanism; and
   wherein when the rotational modulation element is rotated in a first rotational direction, the shift modulation element pulls the masking element in a first shift direction to adjust the size of the cavity.

2. The down converter of claim 1, wherein the fine-tuning mechanism is capable of adjusting the size of the cavity by performing a shifting movement caused by a rotational movement.

3. The down converter of claim 1, wherein when the rotational modulation element is rotated in a second rotational direction, the shift modulation element pushes the masking element in a second shift direction to adjust the size of the cavity.

4. The down converter of claim 1, wherein the rotational modulation element comprises:
   an internal thread; and
   an external thread;
   wherein the rotational modulation element is threaded into the fixed element with the external thread, and mates with the shift modulation element with the internal thread.

5. The down converter of claim 4, wherein the shift modulation element comprises:
   a threaded element mating with the internal thread of the rotational modulation element; and
   an engaging element connected to the threaded element.

6. The down converter of claim 5, wherein the masking element comprises a groove that comprises an inserting opening and a constraining opening, and the engaging element of the shift modulation element is disposed across the constraining opening.

7. The down converter of claim 6, wherein the shift modulation element is capable of being engaged with the masking element by the engaging element being slid from the inserting opening to the constraining opening.

8. The down converter of claim 1, wherein the filter is applied to filter out noise between 17.3 GHz and 18.3 GHz in a frequency domain.

9. A method for adjusting wave bandwidths of down conversion, comprising:
   providing a down converter of claim 1;
   adjusting the size of the cavity using the fine-tuning mechanism to obtain a specific down conversion effect of the down converter; and
   constraining movement of the fine-tuning mechanism to fix the size of the cavity.

10. The method of claim 9, wherein constraining movement of the fine-tuning mechanism comprises applying viscose to the adjusting mechanism.

11. The method of claim 9, wherein constraining movement of the fine-tuning mechanism comprises applying welding fluid to the fine-tuning mechanism.

12. A shielding structure comprising:
    a cavity; and
    a fine-tuning mechanism comprising:
       a fixed element comprising an opening;
       a rotational modulation element rotatably connected to the fixed element through the opening; and
       a masking element comprising a shift modulation element thread-connected to the rotational modulation element;
    wherein when the rotational modulation element is rotated in a first rotational direction, the masking element shifts in a first shift direction to adjust the size of the cavity.

13. A shielding structure comprising:
    a cavity; and
    a fine-tuning mechanism comprising:
       a fixed element;
       a rotational modulation element rotatably connected to the fixed element;
       a shift modulation element thread-connected to the rotational modulation element; and
       a masking element connected to the shift modulation element;
    wherein when the rotational modulation element is rotated in a first rotational direction, the shift modulation element pulls the masking element in a first shift direction to adjust the size of the cavity.

14. The shielding structure of claim 13, wherein when the rotational modulation element is rotated in a second rotational direction, the shift modulation element pushes the masking element in a second shift direction to adjust the size of the cavity.

15. A down converter comprising:
    a housing;
    a down conversion circuit disposed in the housing and comprising at least one filter; and
    a shielding structure disposed above the down conversion circuit and comprising at least one cavity disposed above the filter and at least one fine-tuning mechanism, the fine-tuning mechanism comprising:
       a fixed element comprising an opening;
       a rotational modulation element engaged with the fixed element through the opening; and
       a masking element comprising a shift modulation element thread-connected to the rotational modulation element;

wherein when the rotational modulation element is rotated in a first rotational direction, the masking element shifts in a first shift direction to adjust the size of the cavity; and wherein a filtering effect is capable of being adjusted by adjusting a size of the cavity with the fine-tuning mechanism.

16. The down converter of claim 15, wherein when the rotational modulation element is rotated in a second rotational direction, the masking element shifts in a second shift direction, opposite the first shift direction, to adjust the size of the cavity.

17. The down converter of claim 16, wherein the filter is applied to filter out noise between 17.3 GHz and 18.3 GHz in a frequency domain.

18. A method for adjusting wave bandwidths of down conversion, comprising:
   providing a down converter of claim 16;
   adjusting the size of the cavity using the fine-tuning mechanism to obtain a specific down conversion effect of the down converter; and
   constraining movement of the fine-tuning mechanism to fix the size of the cavity.

19. The method of claim 18, wherein constraining movement of the fine-tuning mechanism comprises applying viscose to the adjusting mechanism.

20. The method of claim 19, wherein constraining movement of the fine-tuning mechanism comprises applying welding fluid to the fine-tuning mechanism.

* * * * *